US012812922B2

(12) United States Patent
Cooper et al.

(10) Patent No.: US 12,812,922 B2
(45) Date of Patent: Nov. 24, 2026

(54) TRANSISTORS WITH FIELD-SHIELD CONTACTS AND BASE CONTACTS

(71) Applicant: GlobalFoundries U.S. Inc., Malta, NY (US)

(72) Inventors: James A. Cooper, Santa Fe, NM (US); Francois Hebert, San Mateo, CA (US)

(73) Assignee: GlobalFoundries U.S. Inc., Malta, NY (US)

( * ) Notice: Subject to any disclaimer, the term of this patent is extended or adjusted under 35 U.S.C. 154(b) by 789 days.

(21) Appl. No.: 18/137,491

(22) Filed: Apr. 21, 2023

(65) Prior Publication Data

US 2024/0355872 A1 Oct. 24, 2024

(51) Int. Cl.

| | |
|---|---|
| ***H01L 29/06*** | (2006.01) |
| ***H10D 12/01*** | (2025.01) |
| ***H10D 30/66*** | (2025.01) |
| ***H10D 62/10*** | (2025.01) |
| ***H10D 62/17*** | (2025.01) |
| ***H10D 62/832*** | (2025.01) |
| ***H10P 30/22*** | (2026.01) |

(52) U.S. Cl.

CPC ......... *H10D 62/109* (2025.01); *H10D 12/031* (2025.01); *H10D 30/668* (2025.01); *H10D 62/393* (2025.01); *H10D 62/8325* (2025.01); *H10P 30/22* (2026.01)

(58) Field of Classification Search

CPC .. H10D 62/109; H10D 12/031; H10D 30/668; H10D 62/393; H10D 62/8325; H10D 30/0297; H10P 30/22

See application file for complete search history.

(56) References Cited

U.S. PATENT DOCUMENTS

| | | | | |
|---|---|---|---|---|
| 6,180,958 | B1 | 1/2001 | Cooper, Jr. | |
| 6,570,185 | B1 | 5/2003 | Tan | |
| 7,498,633 | B2 | 3/2009 | Cooper et al. | |
| 2024/0234507 | A1 * | 7/2024 | Sampath .............. | H10D 12/031 |

OTHER PUBLICATIONS

J. Tan, J. A. Cooper, Jr., and M. R. Melloch, "High-Voltage Accumulation-Layer UMOSFETs in 4H-SiC," IEEE Electron Device Letters, vol. 19, No. 12, pp. 487-489, Dec. 1998.

(Continued)

*Primary Examiner* — Cuong B Nguyen

(74) *Attorney, Agent, or Firm* — Thompson Hine LLP; Francois Pagette

(57) ABSTRACT

Structures for a transistor and methods of forming a structure for a transistor. The structure comprises a semiconductor substrate including a top surface and a trench, a gate electrode disposed in the trench, a first doped region disposed beneath the trench, a first contact coupled to the first doped region, a second doped region disposed in a vertical direction between the first doped region and the top surface, and a plurality of second contacts coupled to the second doped region. The semiconductor substrate comprises a wide bandgap semiconductor material. The first contact extends in the semiconductor substrate from the top surface to a first depth that adjoins the first doped region. The plurality of second contacts extend in the semiconductor substrate from the top surface to a second depth that adjoins the second doped region, and the second depth is less than the first depth.

20 Claims, 8 Drawing Sheets

(56) References Cited

OTHER PUBLICATIONS

M. Sampath, D. T. Morisette, and J. A. Cooper, “A Fully Self-Aligned SiC Trench MOSFET with 0.5 μm Channel Pitch,” International Conference on Silicon Carbide and Related Materials (ICSCRM2022), Davos, Switzerland, Sep. 11-16, 2022.
C-Y. Lu, “Design and Fabrication of High Performance UMOSFETs in 4H-SiC”, Ph.D. Thesis, Purdue University, Dec. 2003.
M. Sampath, “Deeply-Scaled, Fully Self-Aligned Trench MOSFETs in 4H-SiC,” Ph.D. Thesis, Purdue University, Aug. 2021.
Fukui, Yutaka, et al. “Effects of Grounding Bottom Oxide Protection Layer in Trench-Gate SiC-MOSFET by Tilted AI Implantation.” Materials Science Forum, vol. 1004, Trans Tech Publications, Ltd., Jul. 2020, pp. 764-769. Crossref, doi:10.4028/www.scientific.net/msf.1004.764.
J. Wei, M. Zhang, H. Jiang, H. Wang and K. J. Chen, “Charge storage effect in SiC trench MOSFET with a floating p-shield and its impact on dynamic performances,” 2017 29th International Symposium on Power Semiconductor Devices and IC’s (ISPSD), Sapporo, Japan, 2017, pp. 387-390, doi: 10.23919/ISPSD.2017.7988985.
J. Wei, M. Zhang, H. Jiang, H. Wang and K. J. Chen, “Dynamic Degradation in SiC Trench MOSFET With a Floating p-Shield Revealed With Numerical Simulations,” in IEEE Transactions on Electron Devices, vol. 64, No. 6, pp. 2592-2598, Jun. 2017, doi: 10.1109/TED.2017.2697763.
X. Li et al., “SiC Trench MOSFET With Integrated Self-Assembled Three-Level Protection Schottky Barrier Diode,” in IEEE Transactions on Electron Devices, vol. 65, No. 1, pp. 347-351, Jan. 2018, doi: 10.1109/TED.2017.2767904.
Dai, Tian, et al. “Design Optimization of 1.2kV 4H-SiC Trench MOSFET.” Materials Science Forum, vol. 963, Trans Tech Publications, Ltd., Jul. 2019, pp. 605-608. Crossref, doi:10.4028/www.scientific.net/msf.963.605.
Jiang Lu et al., “A 1200 V SiC Trench MOSFET with a Laterally Widened P-Shield Region to Enhance the Short-Circuit Ruggedness” Electronics 11, No. 7: 1077. (2022) https://doi.org/10.3390/electronics11071077.
Tanaka, Rina, et al. “Performance Improvement of Trench-Gate SiC MOSFETs by Localized High-Concentration N-Type Ion Implantation.” Materials Science Forum, vol. 1004, Trans Tech Publications, Ltd., Jul. 2020, pp. 770-775. Crossref, doi:10.4028/www.scientific.net/msf.1004.770.
Sampath, Madankumar, et al. “Comparison of Single- and Double-Trench UMOSFETs in 4H-SiC.” Materials Science Forum, vol. 924, Trans Tech Publications, Ltd., Jun. 2018, pp. 752-755. Crossref, doi: 10.4028/www.scientific.net/msf.924.752.
Sampath, Madankumar, et al. “The Imosfet: A Deeply-Scaled Fully-Self-Aligned Trench MOSFET.” Materials Science Forum, vol. 1004, Trans Tech Publications, Ltd., Jul. 2020, pp. 751-757. Crossref, doi: 10.4028/www.scientific.net/msf.1004.751.
Paul Lienert, “Exclusive: Automakers to double spending on EVs, batteries to $1.2 trillion by 2030”, Oct. 25, 2022, retrieved from <https://www.reuters.com/technology/exclusive-automakers-double-spending-evs-batteries-12-trillion-by-2030-2022-10-21/>.

* cited by examiner

TRANSISTORS WITH FIELD-SHIELD CONTACTS AND BASE CONTACTS

BACKGROUND

The disclosure relates to semiconductor devices and integrated circuit manufacture and, more specifically, to structures for a transistor and methods of forming a structure for a transistor.

Wide bandgap semiconductors, such as silicon carbide, may be used in high-power applications and/or high-temperature applications. Silicon carbide is well suited for power switching because of advantageous properties, such as a high saturated drift velocity, a high critical field strength, an exceptional thermal conductivity, and a significant mechanical strength. A metal-oxide-semiconductor field-effect transistor is a type of gate-voltage-controlled power switching device that uses field inversion as a current control mechanism. A metal-oxide-semiconductor field-effect transistor may leverage the advantageous properties of silicon carbide to enable, for example, power converters, motor inverters, and motor drivers that are characterized by high reliability and high efficiency when operating at a high voltage.

Improved structures for a transistor and methods of forming a structure for a transistor are needed.

SUMMARY

In an embodiment of the invention, a structure for a field-effect transistor is provided. The structure comprises a semiconductor substrate including a top surface and a trench, a gate electrode disposed in the trench, a first doped region disposed beneath the trench, a first contact coupled to the first doped region, a second doped region disposed in a vertical direction between the first doped region and the top surface, and a plurality of second contacts coupled to the second doped region. The semiconductor substrate comprises a wide bandgap semiconductor material. The first contact extends in the semiconductor substrate from the top surface to a first depth that adjoins the first doped region. The second contacts extend in the semiconductor substrate from the top surface to a second depth that adjoins the second doped region, and the second depth is less than the first depth.

In an embodiment of the invention, a method of forming a structure for a field-effect transistor is provided. The method comprises forming a trench in a semiconductor substrate, forming a first doped region disposed beneath the trench, forming a gate electrode disposed in the trench, forming a second doped region disposed in a vertical direction between the first doped region and a top surface of the semiconductor substrate includes a top surface, forming a first contact coupled to the first doped region, and forming a plurality of second contacts coupled to the second doped region. The semiconductor substrate comprises a wide bandgap semiconductor material, the first contact extends in the semiconductor substrate from the top surface to a first depth that adjoins the first doped region, the second contacts extend in the semiconductor substrate from the top surface to a second depth that adjoins the second doped region, and the second depth is less than the first depth.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
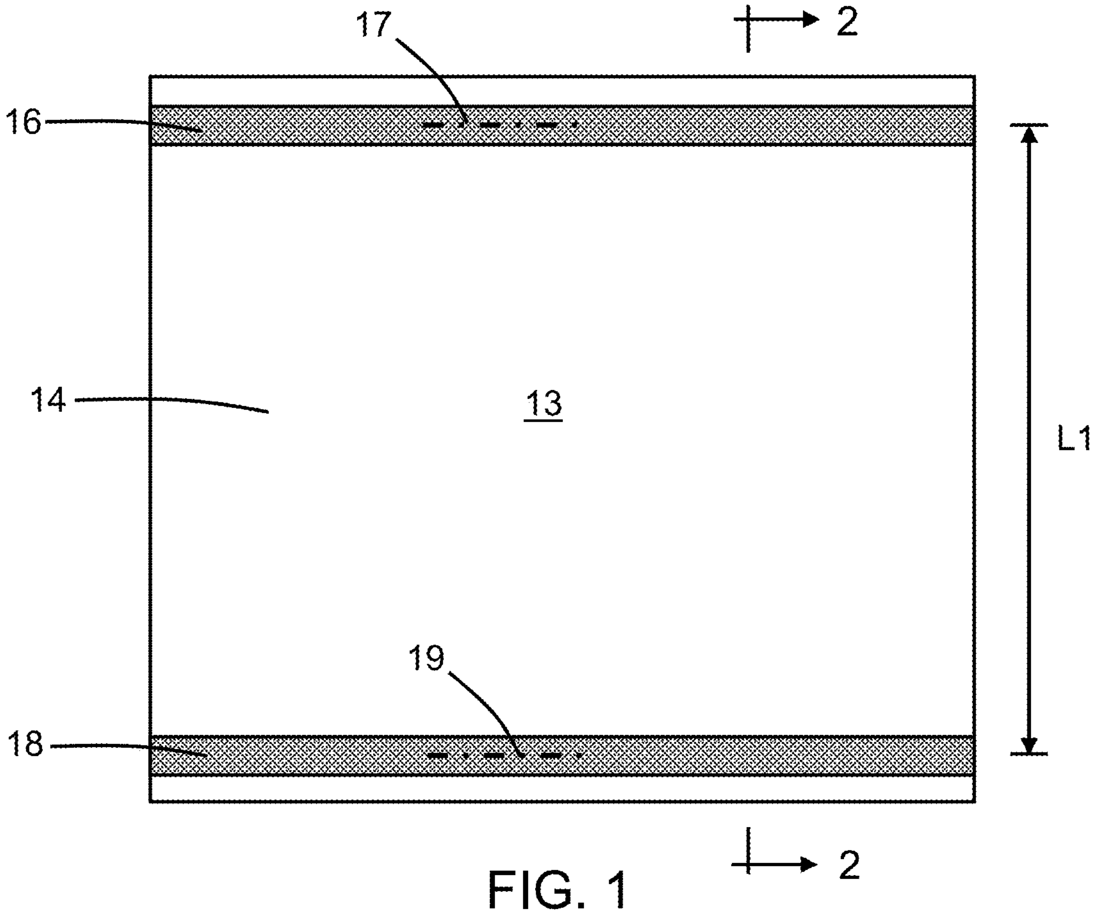
FIG. 1 is a top view of a structure at an initial fabrication stage of a processing method in accordance with embodiments of the invention.
Figure 2:
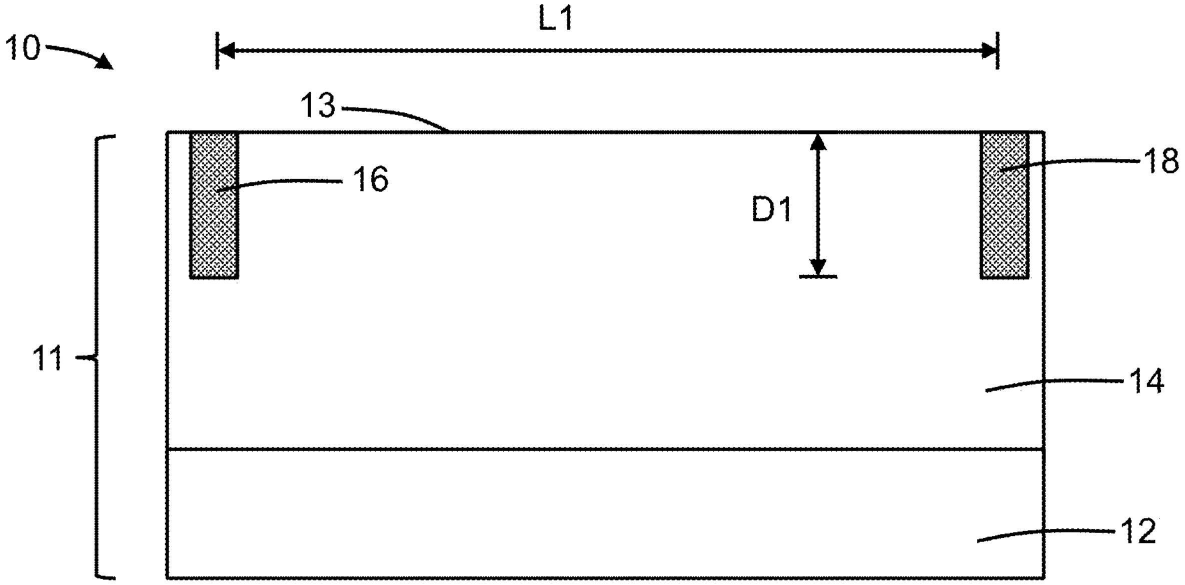
FIG. 2 is a cross-sectional view taken generally along line 2-2 in FIG. 1.

With reference to FIGS. 1, 2 and in accordance with embodiments of the invention, a structure 10 for a field-effect transistor may be formed using a semiconductor substrate 11 that includes a bulk substrate 12 and a semiconductor layer 14. The semiconductor layer 14 may be formed by, for example, epitaxial growth on the bulk substrate 12. The semiconductor substrate 11 may have a top surface 13 that is coextensive with the top surface of the semiconductor layer 14. In an embodiment, the semiconductor layer 14 of the semiconductor substrate 11 may be comprised of a wide bandgap semiconductor material. In an embodiment, the bulk substrate 12 of the semiconductor substrate 11 may be comprised of a wide bandgap semiconductor material. In an embodiment, the bulk substrate 12 and the semiconductor layer 14 may be comprised of a wide bandgap semiconductor material. In an embodiment, the wide bandgap semiconductor material may be silicon carbide. In an embodiment, the wide bandgap semiconductor material may be diamond. In an embodiment, the bulk substrate 12 and the semiconductor layer 14 may be comprised of a semiconductor material having a melting point greater than the melting point of silicon. In an embodiment, the bulk substrate 12 and the semiconductor layer 14 may be comprised of silicon carbide that is doped to have n-type electrical conductivity. In an embodiment, the bulk substrate 12 and the semiconductor layer 14 may be comprised of silicon carbide that is doped to have n-type electrical conductivity with the bulk substrate 12 having a higher dopant concentration and a lower electrical resistivity than the semiconductor layer 14. In an embodiment, the bulk substrate 12 may have a resistivity of less than 25 mOhm-cm.

In an embodiment, the semiconductor layer 14 may include a buffer region grown directly on the bulk substrate 12 and a drift region grown on the buffer region, and the drift region may have a dopant concentration and a thickness that are optimized for device operation in a given voltage range. In an embodiment, the bulk substrate 12 may operate as the drain of the field-effect transistor and may be contacted by, for example, a metal layer at the backside of the bulk substrate 12.

Doped regions 16, 18 may be formed as stripes of doped semiconductor material in the semiconductor layer 14. The doped regions 16, 18 may be formed by introducing a dopant of a given conductivity type by, for example, ion implantation into the semiconductor layer 14. An implantation mask may be formed to define selected areas on the top surface 13 of the semiconductor substrate 11 that are exposed for the implantation of ions. The implantation mask may include a hardmask that is applied and patterned to form openings exposing the selected areas on the top surface 13 and determining, at least in part, the location and horizontal dimensions of the doped regions 16, 18. The implantation conditions (e.g., ion species, dose, kinetic energy, substrate temperature) may be selected to tune the electrical and physical characteristics of the doped regions 16, 18, to minimize defects, and to maximize the ionization and activation of the implanted dopants. High kinetic energies are required to implant the ions with the needed projected range in the semiconductor layer 14. In an embodiment, the ion implantation may be performed at substrate temperature in a range of 25° C. to 600° C. to minimize defect formation. The implantation mask, which is compatible with the implantation conditions and is stripped following implantation, has a thickness and stopping power sufficient to block the implantation of ions in masked areas. In an embodiment, the doped regions 16, 18 may be doped (e.g., heavily doped) with a concentration of a p-type dopant (e.g., aluminum) to provide p-type electrical conductivity.

The doped regions 16, 18, which are accessible at the top surface 13, provide contacts extending from the top surface 13 to subsequently-formed field-shield regions. The doped region 16 is spaced in a lateral direction from the doped region 18 by a distance or spacing L1. The spacing L1 between the doped region 16 and the doped region 18 may be selected to minimize the effect of the doped regions 16, 18 on the on-state performance of the field-effect transistor. The doped region 16 may be aligned along a longitudinal axis 17, and the doped region 18 may be aligned along a longitudinal axis 19. In an embodiment, the longitudinal axis 17 of the doped region 16 may be aligned parallel to the longitudinal axis 19 of the doped region 18. In an embodiment, the spacing L1 may be measured center-to-center from the longitudinal axis 17 of the doped region 16 to the longitudinal axis 19 of the doped region 18. The doped regions 16, 18 extend from the top surface 13 to a maximum depth D1 in the semiconductor layer 14.

Figure 3:
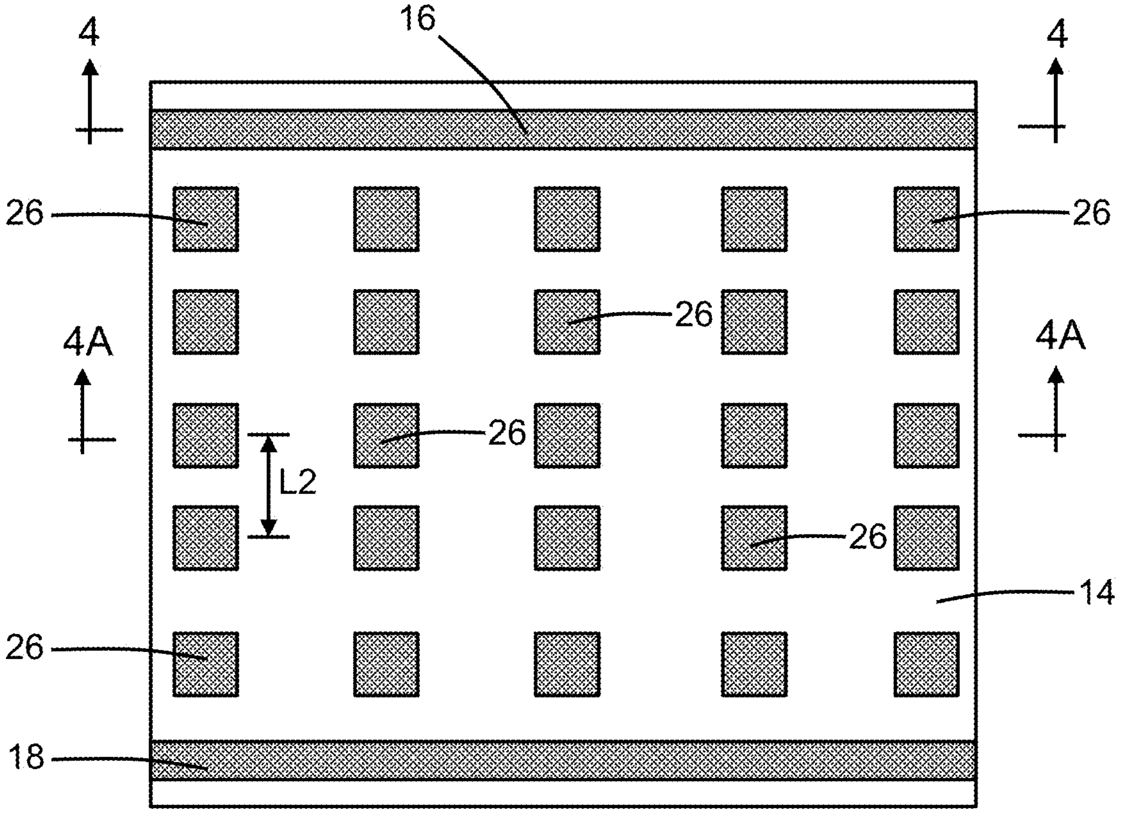
FIG. 3 is a top view of the structure at a fabrication stage of the processing method subsequent to FIG. 1.
Figure 4:
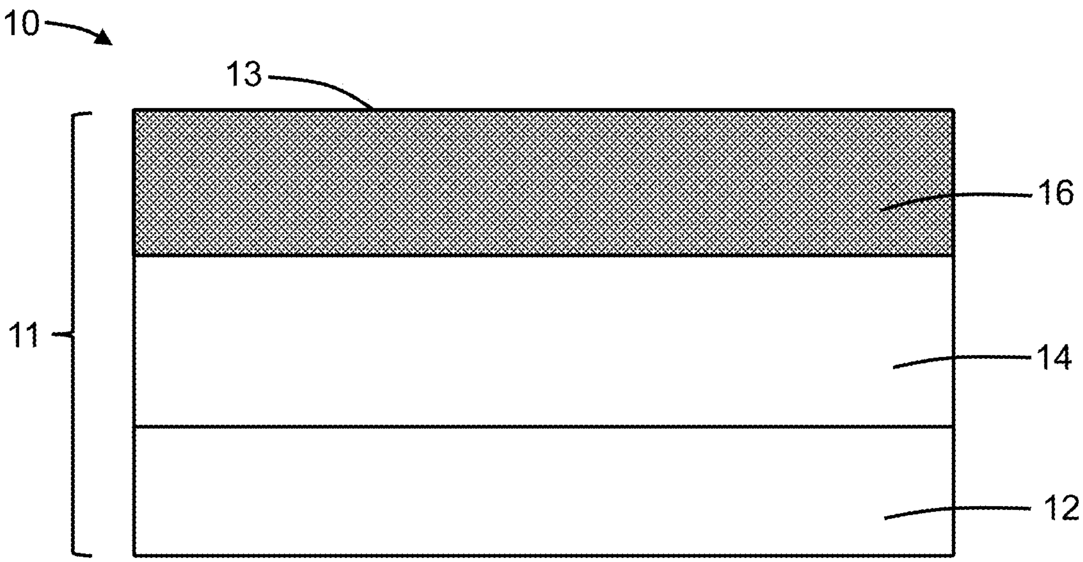
FIG. 4 is a cross-sectional view taken generally along line 4-4 in FIG. 3.
Figure 4A:
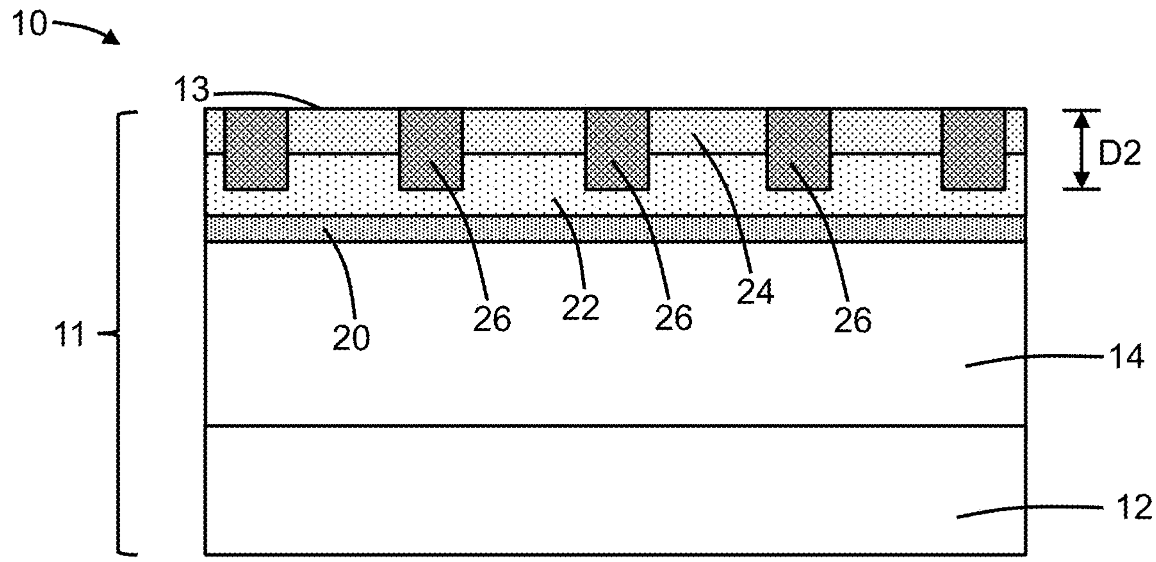
FIG. 4A is a cross-sectional view taken generally along line 4A-4A in FIG. 3.
Figure 5:
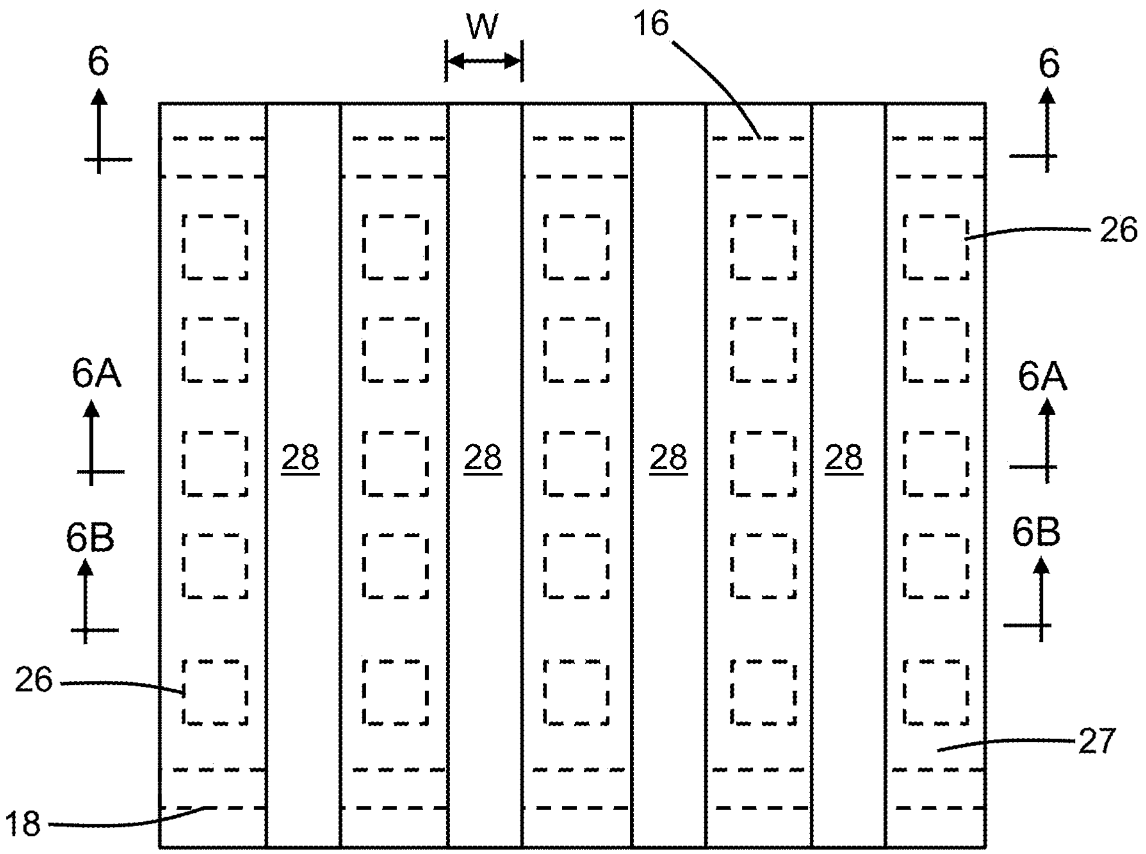
FIG. 5 is a top view of the structure at a fabrication stage of the processing method subsequent to FIG. 3.

With reference to FIGS. 3, 4, 4A in which like reference numerals refer to like features in FIGS. 1, 2 and at a subsequent fabrication stage, a doped region 20 may be formed in the semiconductor layer 14. The doped region 20 is buried relative to the top surface 13. The doped region 20 has the same conductivity type as the semiconductor layer 14 but at a higher dopant concentration. In an embodiment, the doped region 20 may define a current spreading layer of the field-effect transistor, as well as a junction field-effect transistor (JFET) region that reduces any parasitic JFET effect between the subsequently-formed trenches. The depth of the doped region 20 may be less than or equal to the maximum depth D1 (FIG. 2) of the doped regions 16, 18.

The doped region 20 may be formed by introducing a dopant of a given conductivity type by, for example, ion implantation into the semiconductor layer 14. An implantation mask may be formed to define a selected area on a top surface 13 that is exposed for the implantation of ions. The implantation mask may include a hardmask that is applied and patterned to form an opening exposing the selected area on the top surface 13 of the semiconductor substrate 11 and determining, at least in part, the location and horizontal dimensions of the doped region 20. The implantation conditions (e.g., ion species, dose, kinetic energy, substrate temperature) may be selected to tune the electrical and physical characteristics of the doped region 20. In an embodiment, the ion implantation may be performed at substrate temperature in a range of 25° C. to 600° C. The implantation mask, which is compatible with the implantation conditions and is stripped following implantation, has a thickness and stopping power sufficient to block the implantation of ions in masked areas. In an embodiment, the doped region 20 may be doped with a concentration of an n-type dopant (e.g., nitrogen and/or phosphorus) to provide n-type electrical conductivity. In an embodiment, the doped region 20 may be doped with a higher concentration of the n-type dopant than the semiconductor layer 14.

A doped region 22 may be formed in the semiconductor layer 14 between the doped region 20 and the top surface 13. The doped region 22, which is buried relative to the top surface 13, is doped to have an opposite conductivity type from the semiconductor layer 14 and doped region 20. The doped region 22 has a lower boundary that defines an interface with the underlying semiconductor material of the doped region 20 across which the dopant type changes. In an embodiment, the doped region 22 may define a body of the field-effect transistor.

The doped region 22 may be formed by introducing a dopant of a given conductivity type by, for example, ion implantation into the semiconductor layer 14. An implantation mask may be formed to define a selected area on a top surface 13 that is exposed for the implantation of ions. The implantation mask may include a hardmask that is applied and patterned to form an opening exposing the selected area on the top surface 13 and determining, at least in part, the location and horizontal dimensions of the doped region 22. The implantation conditions (e.g., ion species, dose, kinetic energy, substrate temperature) may be selected to tune the electrical and physical characteristics of the doped region 22, to minimize defects, and to maximize the ionization and activation of the implanted dopants. In an embodiment, the ion implantation may be performed at substrate temperature in a range of 25° C. to 600° C. The implantation mask, which is compatible with the implantation conditions and is stripped following implantation, has a thickness and stopping power sufficient to block the implantation of ions in masked areas. In an embodiment, the doped region 22 may be doped with a concentration of a p-type dopant (e.g., aluminum) to provide p-type electrical conductivity.

A doped region 24 may be formed in the semiconductor layer 14 between the doped region 22 and the top surface 13. The doped region 24 has the same conductivity type as the semiconductor layer 14 but at a higher dopant concentration. The doped region 24 has an upper boundary that may be coplanar or substantially coplanar with the top surface 13 and a lower boundary that defines an interface with the doped region 22 across which the conductivity type changes. In an embodiment, the doped region 24 may define a source of the field-effect transistor.

The doped region 24 may be formed by introducing a dopant of a given conductivity type by, for example, ion implantation into the semiconductor layer 14. An implantation mask may be formed to define a selected area on a top surface 13 that is exposed for the implantation of ions. The implantation mask may include a hardmask that is applied and patterned to form an opening exposing the selected area on the top surface 13 and determining, at least in part, the location and horizontal dimensions of the doped region 24. The implantation conditions (e.g., ion species, dose, kinetic energy, substrate temperature) may be selected to tune the electrical and physical characteristics of the doped region 24. In an embodiment, the ion implantation may be performed at substrate temperature in a range of 25° C. to 600° C. The implantation mask, which is compatible with the implantation conditions and is stripped following implantation, has a thickness and stopping power sufficient to block the implantation of ions in masked areas. In an embodiment, the doped region 24 may be doped (e.g., heavily doped) with a concentration of an n-type dopant (e.g., nitrogen and/or phosphorus) to provide n-type electrical conductivity. In an embodiment, the doped region 24 may be doped with a higher concentration of the n-type dopant than the semiconductor layer 14.

Doped regions 26 may be formed as contacts in the semiconductor layer 14. The doped regions 26 are distributed in rows between the doped region 16 and the doped region 18. The doped regions 26 may extend from the top surface 13 to a maximum depth D2 that adjoins the doped region 22 in order to enable physical and electrical coupling of the doped regions 26 to the doped region 22. In an embodiment, the maximum depth D2 may be located between the interface between the doped regions 20, 22 and the interface between the doped regions 22, 24. The maximum depth D2 is less than the maximum depth D1 of the doped regions 16, 18. The doped regions 26 have an opposite conductivity type from the semiconductor layer 14 and the same conductivity type as the doped regions 16, 18 and the doped region 22. The doped regions 26, which are accessible at the top surface 13, may define contacts to the doped region 22 of the field-effect transistor providing the body of the field-effect transistor. The doped regions 26 also function to short the doped region 24 to the doped region 22 in order to reduce or kill any parasitic NPN bipolar junction transistor action between the doped region 24, the doped region 22, and the doped region 20 and semiconductor layer 14.

The doped regions 26 may be formed by introducing a dopant of a given conductivity type by, for example, ion implantation into the semiconductor layer 14. An implantation mask may be formed to define selected areas on a top surface 13 that are exposed for the implantation of ions. The implantation mask may include a hardmask that is applied and patterned to form openings exposing the selected areas on the top surface 13 and determining, at least in part, the location and horizontal dimensions of the doped regions 26. The implantation conditions (e.g., ion species, dose, kinetic energy, substrate temperature) may be selected to tune the electrical and physical characteristics of the doped regions 26. The implantation forming the doped regions 26 may be performed at a lower kinetic energy than the implantation used to form the doped regions 16, 18. In an embodiment, the ion implantation may be performed at substrate temperature in a range of 25° C. to 600° C. The implantation mask, which is compatible with the implantation conditions and is stripped following implantation, has a thickness and stopping power sufficient to block the implantation of ions in masked areas. In an embodiment, the doped regions 26 may be doped (e.g., heavily-doped) with a concentration of a p-type dopant (e.g., aluminum) to provide p-type electrical conductivity.

Adjacent pairs of the doped regions 26 in each row are spaced in a lateral direction from each other by a distance or spacing L2. In an embodiment, the spacing L2 between the adjacent pairs of the doped regions 26 may be a centerline-to-centerline measurement. In an embodiment, the spacing L2 may range from about 4 microns to about 8 microns. In an embodiment, the spacing L2 may range from about 4 microns to about 15 microns. The spacing L2 may be selected to limit the lateral voltage drop due to lateral current flow along doped region 22 during transient switching from the on state to the blocking state. The spacing L1 (FIG. 1) between the doped regions 16, 18 is greater than the spacing L2 between the adjacent pairs of the doped regions 26 such that multiple doped regions 26 in each row are disposed between the doped region 16 and the doped region 18. In an embodiment, the spacing L1 between the doped regions 16, 18 may be ten (10) times to twenty (20) times greater than the spacing L2 between the adjacent pairs of the doped regions 26. In an embodiment, the spacing L1 between the doped regions 16, 18 may be five (5) times to twenty (20) times greater than the spacing L2 between the adjacent pairs of the doped regions 26. In an embodiment, the spacing L1 between the doped regions 16, 18 may be two (2) times to twenty (20) times greater than the spacing L2 between the adjacent pairs of the doped regions 26.

In alternative embodiments, the implantations forming the doped regions 16, 18, doped region 20, doped region 22, doped region 24, and doped regions 26 may be performed in a different order from that presented.

With reference to FIGS. 5, 6, 6A, 6B in which like reference numerals refer to like features in FIGS. 3, 4, 4A and at a subsequent fabrication stage, a hardmask 27 may be formed on the top surface 13 of the semiconductor substrate 11 and patterned by lithography and etching processes. In an embodiment, the hardmask 27 may be comprised of a dielectric material, such as silicon dioxide.

Trenches 28 are formed in the semiconductor layer 14 by an etching process using the hardmask 27. Each trench 28 includes a bottom 32 and sidewalls 31 that extend upward from the bottom 32 to the top surface 13. In an embodiment, the trenches 28 may extend through the doped regions 24, 22 and at least partially through the doped region 20 to the bottom 32. In an embodiment, each trench 28 may extend to a depth in the semiconductor substrate 11 at the bottom 32 that is less than the maximum depth D1 of the doped regions 16, 18 and greater than the maximum depth D2 of the doped regions 26. In an alternative embodiment, the trenches 28 may extend fully through the doped regions 20, 22, 24 and partially through the underlying semiconductor layer 14. Each row of the doped regions 26 is disposed in a lateral direction between an adjacent pair of the trenches 28. Each trench 28 has a width dimension W, at the bottom 32, in a direction perpendicular to the length of the trench 28.

The rows of doped regions 26 extend parallel to the length of the trenches 28. Each trench 28 is disposed in a lateral direction between adjacent rows of the doped regions 26. In particular, the doped regions 26 in each row are disposed in a lateral direction between the adjacent sidewalls 31 of a pair of trenches 28. The doped regions 26 in each row may be separated by gaps G from the adjacent sidewalls 31 of nearest-neighbor trenches 28. Portions of the doped regions 22, 24 are arranged in each gap G. For example, the distance between the adjacent sidewalls 31 of nearest-neighbor trenches 28 may be about one (1) micron, and the gaps G on both sides of each doped region 26 may be about 0.25 microns.

The locations of the doped regions 26 in the structure 10 may be optimized to improve the performance of the field-effect transistor. For example, the locations of the doped regions 26 may be optimized to enable an improvement to the figure of merit provided by the product of the drain-source on resistance and area because the area occupied by the doped regions 26 can be reduced in comparison to conventional layouts that lack such shallow contacts to the doped regions 20, 22. The doped regions 26 may also enable a reduced cell pitch that functions to minimize the specific resistance.

A doped region 30 may be formed in the semiconductor layer 14 adjacent to the bottom 32 of each trench 28. The doped regions 30 are positioned in a vertical direction between the trenches 28 and the bulk substrate 12 operating as the drain of the field-effect transistor. The doped regions 30 have an opposite conductivity type from the semiconductor layer 14 and the same conductivity type as the doped regions 16, 18. The doped regions 30, which are formed after forming the trenches 28 and are self-aligned to the trenches 28, may define p-shields (i.e., electric field shield regions) of the field-effect transistor that are effective to reduce the peak electric field at the bottom of the trenches 28.

The doped regions 30 may be formed by introducing a dopant of a given conductivity type by, for example, ion implantation into the semiconductor layer 14. The trenches 28 may determine, at least in part, the location and horizontal dimensions of the doped regions 30. In particular, due to the self-alignment of the doped regions 30 to the trenches 28, the width dimension of each doped region 30 may be equal or substantially equal to the width dimension W at the bottom 32 of the trenches 28. The hardmask 27 has a thickness and stopping power sufficient to block the implantation of ions in masked areas. The implantation conditions (e.g., ion species, dose, kinetic energy, substrate temperature) may be selected to tune the electrical and physical characteristics of the doped regions 30. In an embodiment, the ion implantation may be performed at substrate temperature in a range of 25° C. to 600° C. In an embodiment, the doped regions 30 may be doped with a concentration of a p-type dopant (e.g., aluminum) to provide p-type electrical conductivity.

The doped regions 16, 18, which have the same conductivity type as the doped regions 30 and adjoin the doped regions 30, are physically and electrically coupled to each of the doped regions 30 at distinct locations spaced along the length of the trenches 28. In that regard, the maximum depth D1 (FIG. 2) of the doped regions 16, 18 may be equal to or slightly greater than an average depth of the doped regions 30. However, the doped regions 30 are not contacted by the doped regions 26, which extend to a shallower maximum depth D2 in the semiconductor substrate 11 than the doped regions 16, 18. The locations at which the doped region 16 and the doped region 18 contact each doped region 30 are spaced along the length of the trenches 28. The doped regions 16, 18 are also coupled to the doped regions 22, 24.

The structure 10 features an optimized layout that minimizes the wasted area for contacting the electric field shields defined by the doped regions 30. The layout can be optimized by considering the purpose and bias restriction of the doped regions 30 to the body contacts defined by the doped regions 26.

A high-temperature anneal may be performed following the implantations to activate the implanted dopants and to alleviate post-implantation crystal damage. The high-temperature anneal may be performed with a removable carbon capping layer applied as a temporary coating and at a high substrate temperature, such as a substrate temperature in a range of 1600° C. to 1900° C. The hardmask 27, which cannot withstand the high anneal temperature, is removed from the top surface 13 before the anneal is performed and before the carbon capping layer is applied. The removable carbon capping layer may prevent silicon outgassing during the high-temperature anneal. The carbon capping layer, which may be comprised of a cured and/or baked photoresist or a deposited layer of carbon, is removed following the high-temperature anneal.

Figure 6:
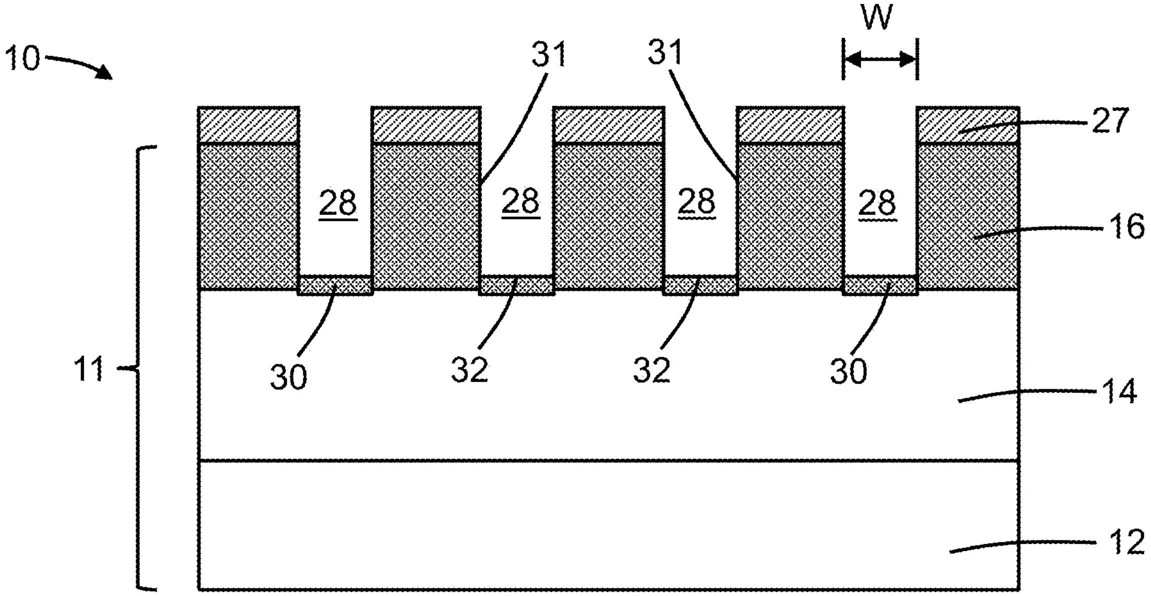
FIG. 6 is a cross-sectional view taken generally along line 6-6 in FIG. 5.
Figure 6A:
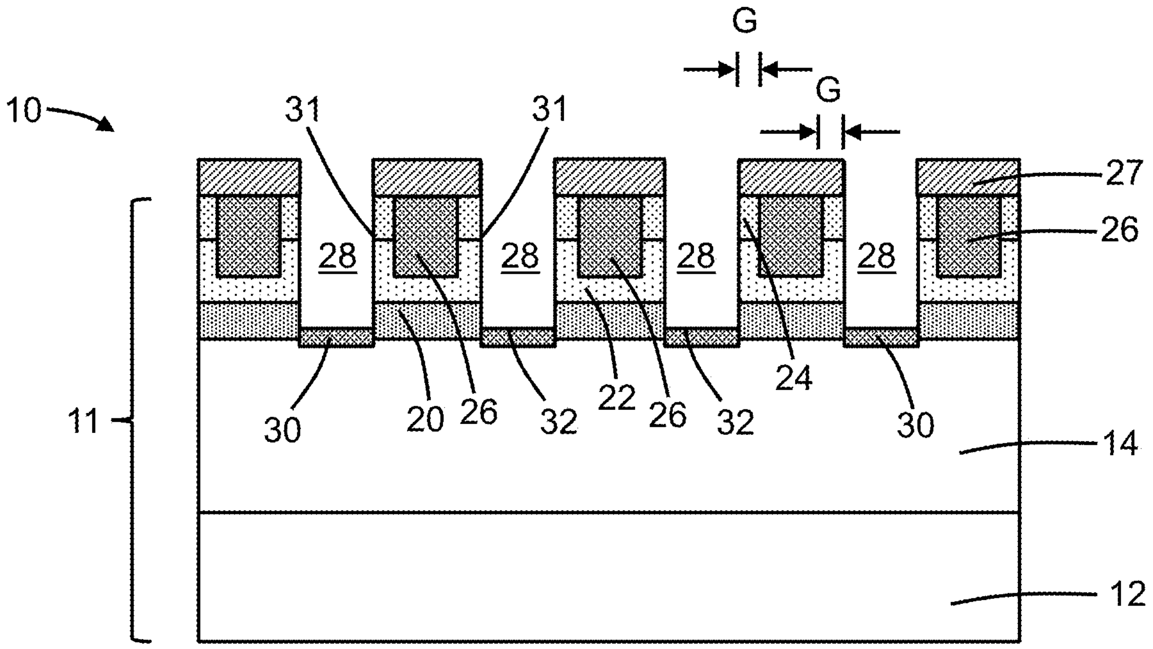
FIG. 6A is a cross-sectional view taken generally along line 6A-6A in FIG. 5.
Figure 6B:
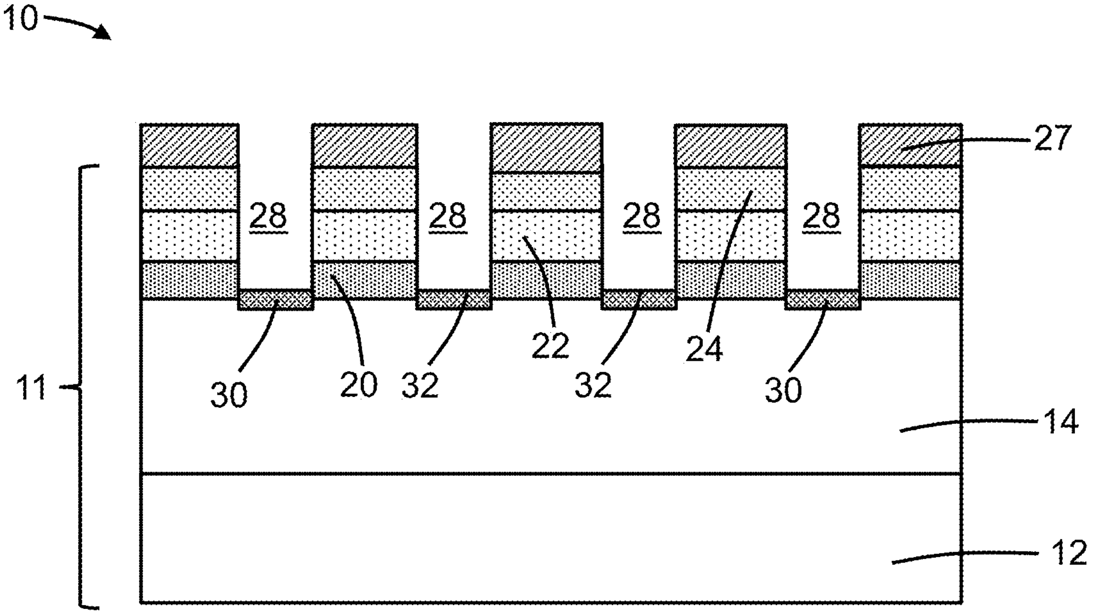
FIG. 6B is a cross-sectional view taken generally along line 6B-6B in FIG. 5.
Figure 7:
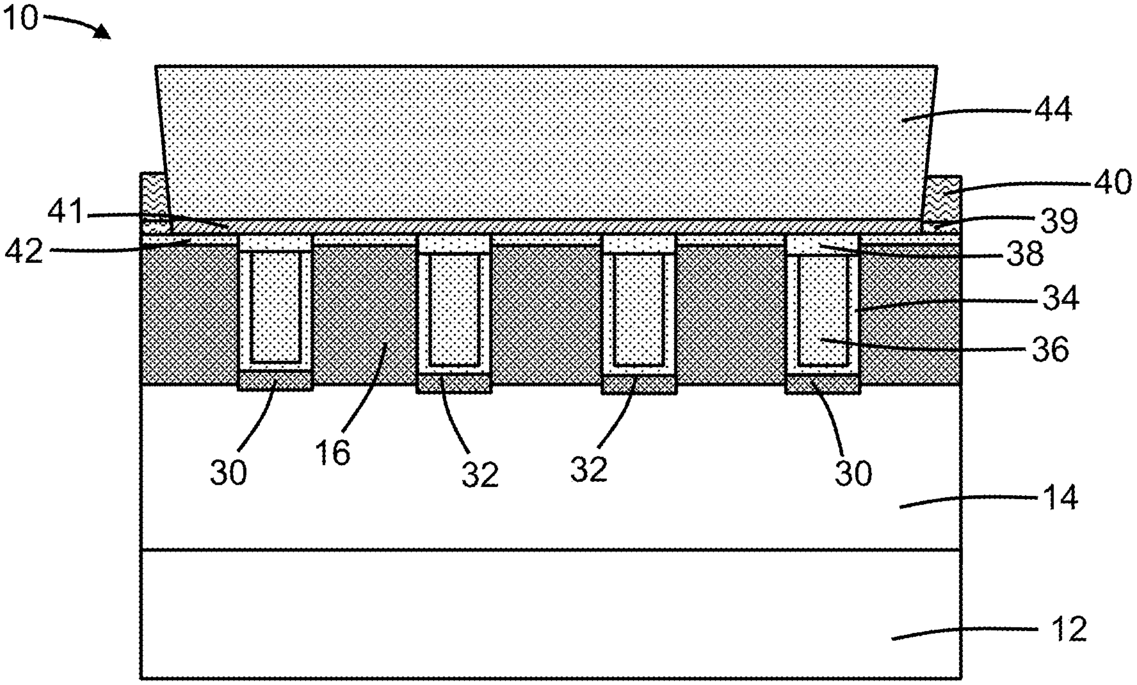
FIGS. 7, 7A, 7B are cross-sectional views of the structure at a fabrication stage of the processing method subsequent to FIGS. 5, 6, 6A, 6B.
Figure 7A:
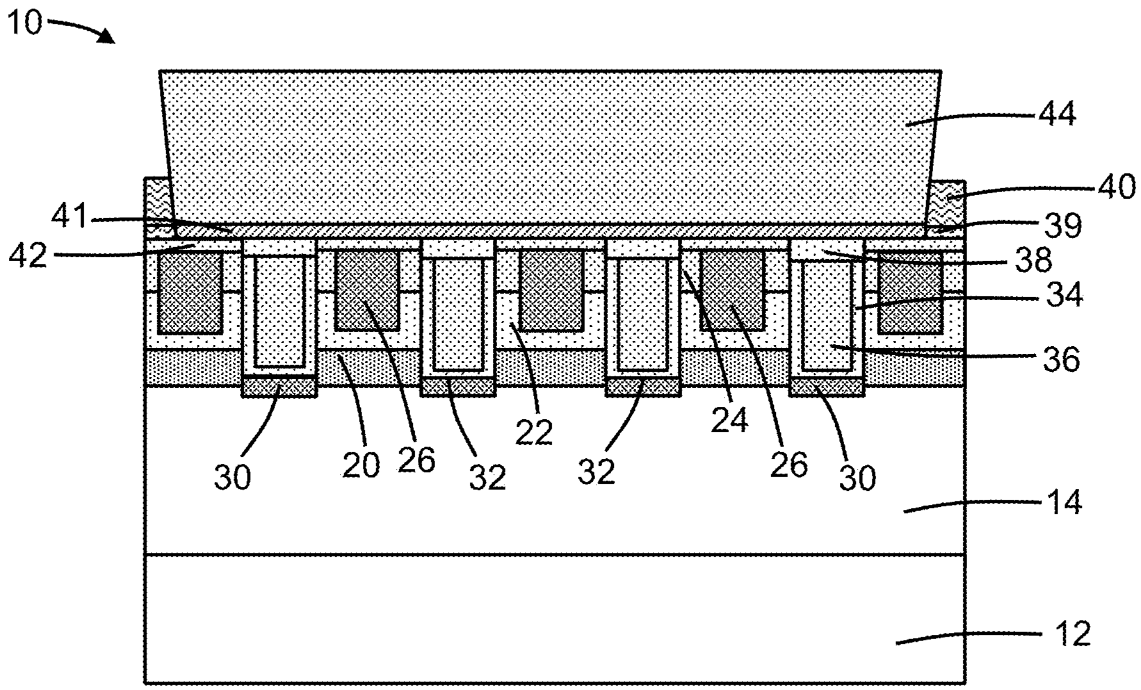
Figure 7B:
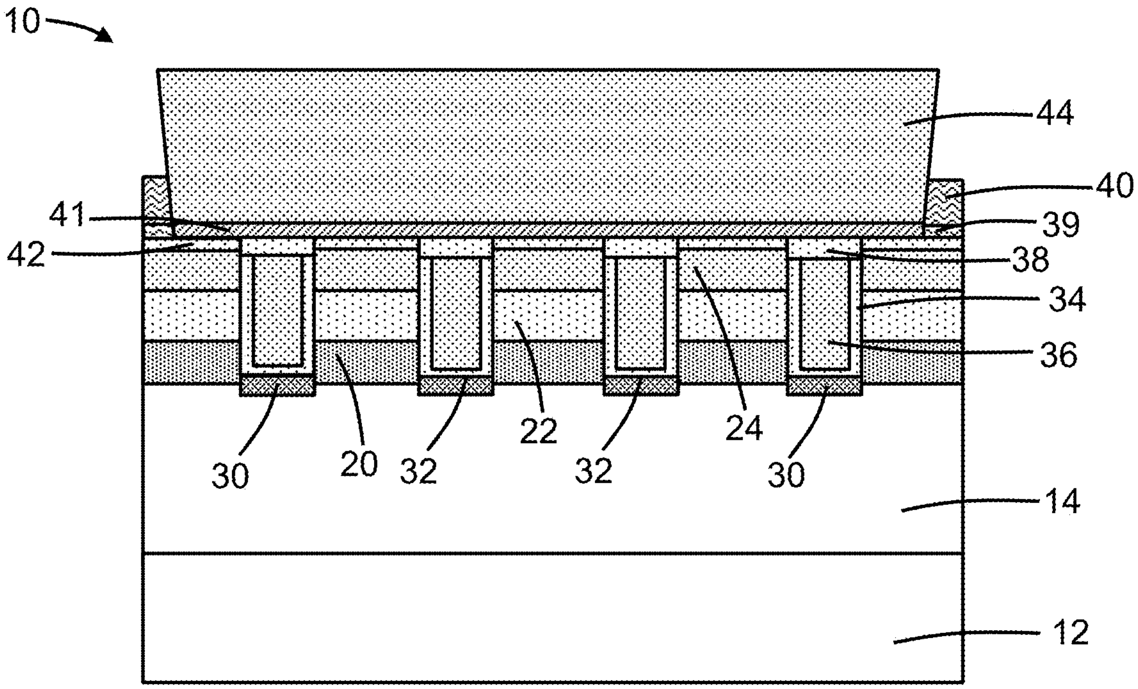

With reference to FIGS. 7, 7A, 7B in which like reference numerals refer to like features in FIGS. 6, 6A, 6B and at a subsequent fabrication stage, a gate dielectric layer 34 is formed on the sidewalls 31 and bottom 32 of each trench 28. In an embodiment, the gate dielectric layer 34 may be formed with a uniform or substantially uniform thickness on the sidewalls 31 and bottom 32 of the trenches 28. The gate dielectric layer 34 may be comprised of a dielectric material, such as silicon dioxide, that is an electrical insulator.

A gate conductor layer 36 is deposited, and the gate dielectric layer 34 and gate conductor layer 36 may be patterned by lithography and etching processes. In an embodiment, the gate conductor layer 36 may be comprised of a conductor, such as polysilicon or amorphous silicon heavily doped with an n-type dopant (e.g., phosphorus or arsenic). The portion of the gate conductor layer 36 inside each trench 28 defines a gate electrode. Portions of the gate dielectric layer 34 are disposed between the gate electrode and the sidewalls 31 of each trench 28, as well as between the gate electrode and the bottom 32 of each trench 28. Each row of the doped regions 26 is disposed in a lateral direction between an adjacent pair of the gate electrodes, which may be longitudinally aligned parallel to the different rows of the doped regions 26. During device operation, each gate electrode can induce an electron inversion layer in the doped region 22 at the sidewalls 31 of the trenches 28 because the dopant concentration in the doped region 22 is minimally increased by the contacts defined by the doped regions 26 that extend only partially through the doped region 22.

In an embodiment, the gate conductor layer 36 of each gate electrode may be recessed inside each trench 28 by an etching process. A dielectric layer 38 may be formed that includes a portion on the gate electrode inside each trench 28. The dielectric layer 38 may be comprised of a dielectric material, such as silicon dioxide, that is an electrical insulator. In an embodiment, the dielectric layer 38 may be formed by oxidizing the material of the gate conductor layer 36 with a thermal oxidation process. The doped regions 30 may function to protect the gate dielectric layer 34 against degradation and premature failure during device operation.

Silicide layers 42 are formed by a silicidation process on exposed areas of the top surface 13. The silicide layers 42 may be comprised of a metal, such as nickel. Dielectric layers 39, 40 may be formed on the top surface 13. The dielectric layer 39 may be an etch stop layer that is comprised of, for example, silicon nitride, and the dielectric layer 40 may be an interlayer dielectric layer comprised of, for example, silicon dioxide. The dielectric layers 39, 40 are patterned with lithography and etching processes to define an opening extending to the top surface 13.

An electrode 44 comprised of, for example, aluminum may be formed inside the opening in the dielectric layers 39, 40. The electrode 44 is electrically coupled by the silicide layers 42 to the doped regions 16, 18, the doped regions 20, 22, the doped regions 26, and the doped regions 30. A barrier layer 41, such as a bilayer of titanium and titanium nitride, may be disposed between the electrode 44 and the silicide layers 42. The portion of the dielectric layer 38 inside each trench 28 electrically isolates the electrode 44 from the gate electrodes defined by the gate conductor layers 36 in the trenches 28.

Figure 8:
FIGS. 8 and 9 are top views of a structure at successive fabrication stages of a processing method in accordance with alternative embodiments of the invention.

With reference to FIG. 8 and in accordance with alternative embodiments, the doped regions 26 may be formed as continuous stripes that may extend parallel to each other and parallel to the doped regions 16, 18 instead of being formed as discontinuous islands. The stripes defining the doped regions 26 may extend parallel to the stripes defining the doped regions 16, 18.

Figure 9:
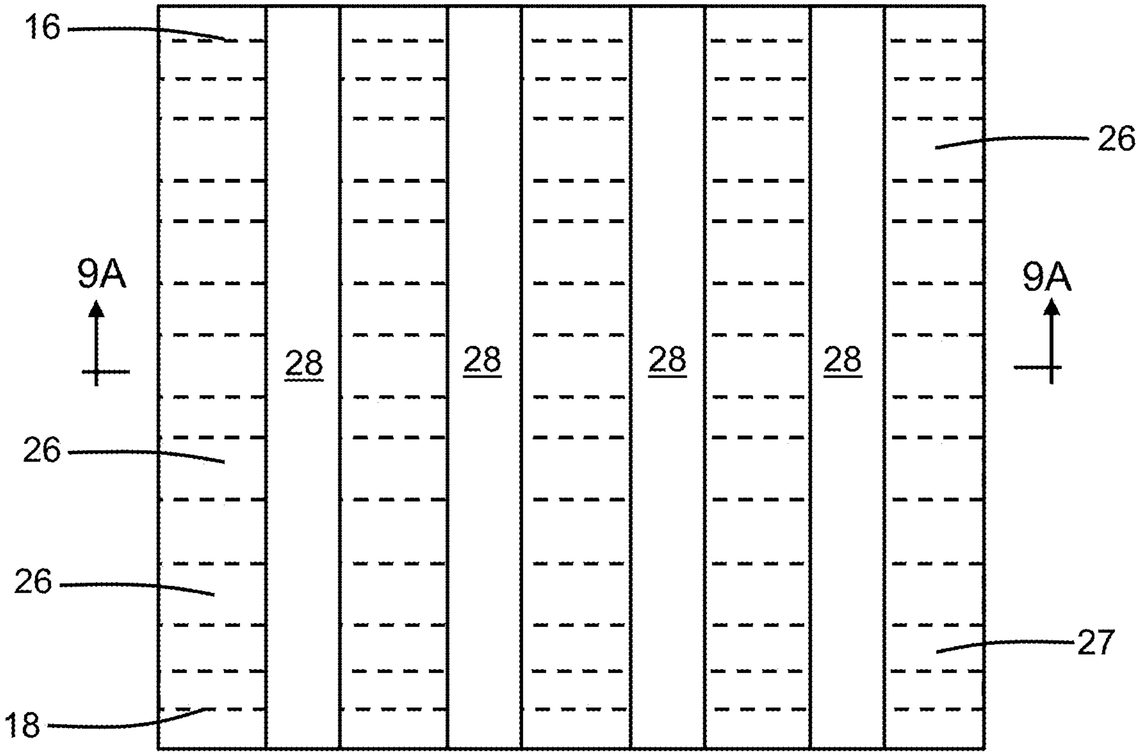
Figure 9A:
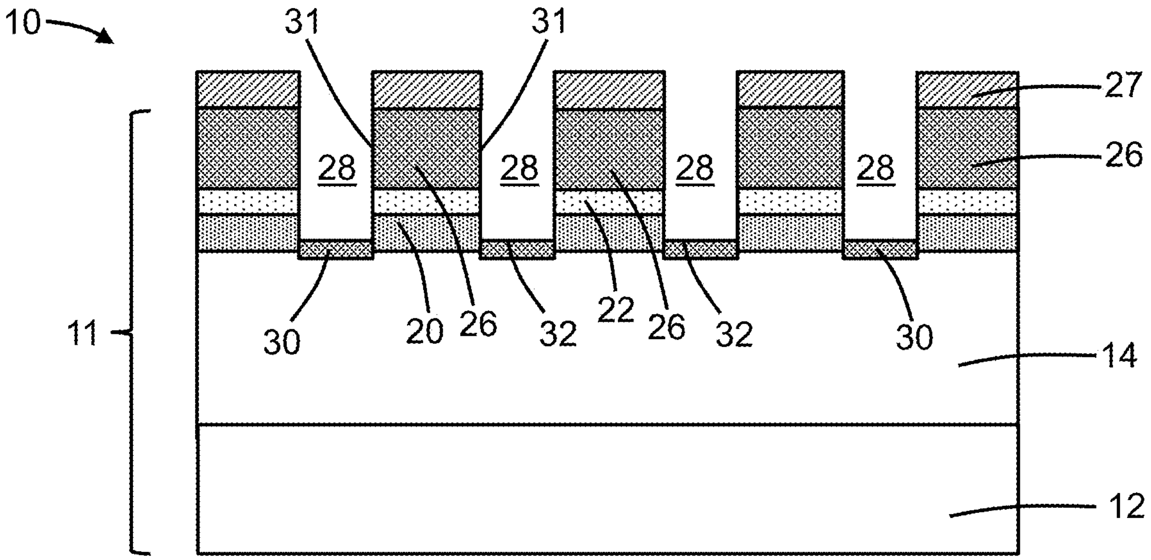
FIG. 9A is a cross-sectional view taken generally along line 9A-9A in FIG. 9.

With reference to FIGS. 9, 9A in which like reference numerals refer to like features in FIG. 8 and at a subsequent fabrication stage, the formation of the trenches 28 defines discontinuities that divide each of the doped regions 26 into segments that are arranged in rows that extend parallel to the doped regions 16, 18. Each trench 28 is disposed in a lateral direction between adjacent rows of the doped regions 26, and each row of doped regions 26 is disposed in a lateral direction between a pair of the trenches 28. In an embodiment, each doped region 26 may adjoin the sidewalls 31 of the adjacent pair of trenches 28 because gaps are absent between the trenches 28 and the doped regions 26.

Processing continues as described hereinabove to complete the structure 10.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate a range of +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction in the frame of reference perpendicular to the horizontal, as just defined. The term "lateral" refers to a direction in the frame of reference within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features "overlap" if a feature extends over, and covers a part of, another feature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for a field-effect transistor, the structure comprising:

a semiconductor substrate including a top surface and a plurality of trenches, the semiconductor substrate comprising a wide bandgap semiconductor material;

a plurality of gate electrodes respectively disposed in the plurality of trenches;

a plurality of first doped regions respectively disposed beneath the plurality of trenches;

a second doped region disposed in a vertical direction between the plurality of first doped regions and the top surface;

a first contact coupled to the plurality of first doped regions, the first contact extending in the semiconductor substrate from the top surface to a first depth that adjoins the plurality of first doped regions; and a plurality of second contacts coupled to the second doped region, the plurality of second contacts extending in the semiconductor substrate from the top surface to a second depth that adjoins the second doped region, and the second depth less than the first depth.

2. The structure of claim 1 wherein the first contact and the plurality of second contacts have a first conductivity type.

3. The structure of claim 2 wherein the plurality of first doped regions and the second doped region have the first conductivity type.

4. The structure of claim 3 further comprising:

a third doped region disposed in the vertical direction between the second doped region and the top surface, the third doped region having a second conductivity type opposite to the first conductivity type.

5. The structure of claim 4 wherein the semiconductor substrate has the second conductivity type, the semiconductor substrate includes a drift region and a drain with different dopant concentrations, the drift region is disposed in the vertical direction between the drain and the second doped region, and the drift region is disposed in the vertical direction between the drain and the third doped region.

6. The structure of claim 1 wherein the wide bandgap semiconductor material comprises silicon carbide.

7. The structure of claim 1 wherein the plurality of trenches extend through the second doped region.

8. The structure of claim 1 wherein the plurality of second contacts are arranged in a row that extends parallel to a length of the plurality of trenches.

9. The structure of claim 1 further comprising:

a third contact coupled to the plurality of first doped regions, the third contact extending in the semiconductor substrate from the top surface to the first depth, wherein the first contact is spaced along a length of the plurality of trenches from the third contact by a first spacing.

10. The structure of claim 9 wherein the plurality of second contacts are spaced along the length of the plurality of trenches by a second spacing, and the first spacing is greater than the second spacing.

11. The structure of claim 10 wherein the first spacing is 2 times to 20 times greater than the second spacing.

12. The structure of claim 1 further comprising:

a plurality of third contacts coupled to the second doped region, the plurality of third contacts extending in the semiconductor substrate from the top surface to the second depth, wherein one of the plurality of trenches is disposed in a lateral direction between the plurality of second contacts and the plurality of third contacts.

13. The structure of claim 1 wherein each of the plurality of trenches includes a plurality of sidewalls and a bottom between the plurality of sidewalls, the plurality of first doped regions are disposed adjacent to the bottom, and the bottom is positioned in the vertical direction between the first depth and the second depth.

14. The structure of claim 13 wherein the plurality of trenches have substantially equal width dimensions.

15. The structure of claim 4 wherein the plurality of trenches extend fully through the third doped region.

16. The structure of claim 15 wherein the plurality of trenches extend partially through the second doped region.

17. The structure of claim 1 wherein the plurality of trenches extend partially through the second doped region.

18. The structure of claim 4 further comprising:

a fourth doped region disposed in the vertical direction between the third doped region and the top surface, the fourth doped region having the first conductivity type.

19. The structure of claim 18 wherein the plurality of trenches extend fully through the third doped region, and the plurality of trenches extend fully through the fourth doped region.

20. A method of forming a structure for a field-effect transistor, the method comprising:

forming a plurality of trenches in a semiconductor substrate, wherein the semiconductor substrate includes a top surface, and the semiconductor substrate comprising a wide bandgap semiconductor material;

forming a plurality of first doped regions respectively disposed beneath the plurality of trenches;

forming a plurality of gate electrodes respectively disposed in the plurality of trenches;

forming a second doped region disposed in a vertical direction between the plurality of first doped regions and the top surface;

forming a first contact coupled to the plurality of first doped regions, wherein the first contact extends in the semiconductor substrate from the top surface to a first depth that adjoins the plurality of first doped regions; and forming a plurality of second contacts coupled to the second doped region, wherein the plurality of second contacts extend in the semiconductor substrate from the top surface to a second depth that adjoins the second doped region, and the second depth is less than the first depth.

* * * * *